(12) United States Patent
Lee et al.

(10) Patent No.: US 12,237,000 B2
(45) Date of Patent: Feb. 25, 2025

(54) SENSE AMPLIFIER CIRCUIT WITH PRECHARGE, MEMORY DEVICE INCLUDING THE SAME AND SENSING METHOD OF MEMORY DEVICE

(71) Applicant: Samsung Electronics Co., Ltd., Suwon-si (KR)

(72) Inventors: Changyoung Lee, Suwon-si (KR); Kyu-Chang Kang, Suwon-si (KR); Donghak Shin, Suwon-si (KR); Hyun-Chul Yoon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 184 days.

(21) Appl. No.: 18/045,846

(22) Filed: Oct. 12, 2022

(65) Prior Publication Data

US 2023/0420034 A1 Dec. 28, 2023

(30) Foreign Application Priority Data

Jun. 28, 2022 (KR) .................. 10-2022-0079181

(51) Int. Cl.
| | | |
|---|---|---|
| G11C 7/06 | (2006.01) | |
| G11C 11/4091 | (2006.01) | |
| G11C 11/4094 | (2006.01) | |
| G11C 11/4097 | (2006.01) | |
| G11C 7/10 | (2006.01) | |

(52) U.S. Cl.
CPC ...... *G11C 11/4091* (2013.01); *G11C 11/4094* (2013.01); *G11C 11/4097* (2013.01); *G11C 7/06* (2013.01); *G11C 7/1048* (2013.01); *G11C 2207/002* (2013.01)

(58) Field of Classification Search
CPC ............ G11C 11/4091; G11C 11/4094; G11C 11/4097; G11C 7/06; G11C 7/1048; G11C 2207/002; G11C 7/12; G11C 7/065; G11C 7/1051
See application file for complete search history.

(56) References Cited

U.S. PATENT DOCUMENTS

| | | | | |
|---|---|---|---|---|
| 4,947,376 A | * | 8/1990 | Arimoto | ............. G11C 11/4091 |
| | | | | 327/51 |
| 6,038,186 A | * | 3/2000 | Tanizaki | ............. G11C 11/4074 |
| | | | | 365/189.11 |
| 8,320,209 B2 | | 11/2012 | Yadav et al. | |

(Continued)

FOREIGN PATENT DOCUMENTS

| | | |
|---|---|---|
| CN | 114400029 A | 4/2022 |
| KR | 102076602 B1 | 2/2020 |

*Primary Examiner* — Mushfique Siddique
(74) *Attorney, Agent, or Firm* — Myers Bigel, P.A.

(57) ABSTRACT

In a sense amplifier circuit, a first transistor is electrically connected between a first bitline and a first node, a first inverter includes a first input terminal and a first output terminal connected to the first node, and a second inverter includes a second input terminal connected to a second node and a second output terminal. A second transistor is electrically connected between the first output terminal and the second node, and a third transistor is electrically connected between the second output terminal and the first node. A precharge circuit transfers a first voltage to the first and second nodes during a first period, and transfers a second voltage higher than the first voltage to the first and second nodes during a second period.

18 Claims, 17 Drawing Sheets

(56) References Cited

U.S. PATENT DOCUMENTS

| | | |
|---|---|---|
| 8,331,162 B2 | 12/2012 | Kim et al. |
| 8,605,528 B2 | 12/2013 | Barth et al. |
| 9,087,558 B2 | 7/2015 | Shin et al. |
| 9,202,531 B2 | 12/2015 | Seo |
| 9,384,802 B2 | 7/2016 | Park |
| 9,646,659 B2 | 5/2017 | Kim |
| 11,127,454 B2 | 9/2021 | Bae |
| 2009/0262587 A1* | 10/2009 | Park .................... G11C 11/4076 365/207 |
| 2013/0114361 A1 | 5/2013 | Barth et al. |
| 2014/0140144 A1* | 5/2014 | Nakazato ............. G11C 7/1012 330/252 |
| 2014/0233336 A1* | 8/2014 | Shin .................... G11C 11/4091 365/205 |
| 2018/0061461 A1* | 3/2018 | Seo .......................... G11C 7/18 |
| 2020/0075065 A1* | 3/2020 | Jeong .................... H03F 1/0205 |
| 2020/0168266 A1* | 5/2020 | Yamazaki ............... H01L 28/91 |
| 2021/0184871 A1* | 6/2021 | Kim ........................ G11C 7/24 |

* cited by examiner

SENSE AMPLIFIER CIRCUIT WITH PRECHARGE, MEMORY DEVICE INCLUDING THE SAME AND SENSING METHOD OF MEMORY DEVICE

CROSS-REFERENCE TO RELATED APPLICATION

This application claims priority to and the benefit of Korean Patent Application No. 10-2022-0079181 filed in the Korean Intellectual Property Office on Jun. 28, 2022, the entire contents of which are incorporated herein by reference.

BACKGROUND

The disclosure relates to a sense amplifier circuit, a memory device including the same, and a sensing method of the memory device.

During a read operation or a refresh operation of a memory device, a sense amplifier may sense data of a memory cell by sensing a voltage difference between a bitline and a complementary bitline. Due to the higher integration of the memory device, a size of the memory cell becomes smaller and a bitline load increases, so it may be difficult to maintain a margin of the voltage difference. If the margin of the voltage difference is not maintained, the data sensing of the memory cell may fail.

SUMMARY

Some embodiments may provide a sense amplifier circuit, a memory device and a sensing method that can maintain a margin of a voltage difference.

According to some embodiments, a sense amplifier circuit including a first bitline, a first transistor, a second transistor, a third transistor, a first inverter, a second inverter, and a precharge circuit may be provided. The first transistor may be electrically connected between the first bitline and a first node. The first inverter may include a first input terminal electrically connected to the first node and a first output terminal, and the second inverter may include a second input terminal electrically connected to a second node and a second output terminal. The second transistor may be connected between the first output terminal and the second node, and the third transistor may be electrically connected between the second output terminal and the first node. The precharge circuit may be electrically connected to the first node and the second node, transfer a first voltage to the first node and the second node during a first time period, and transfer a second voltage higher than the first voltage to the first node and the second node during a second time period.

In some embodiments, the sense amplifier circuit may further include a second bitline that forms a complementary bitline pair with the first bitline, and a fourth transistor electrically connected between the second bitline and the second node.

In some embodiments, the first voltage may be a ground voltage.

In some embodiments, the first inverter may be electrically connected between a first voltage line configured to transfer a third voltage and a second voltage line configured to transfer the first voltage, and the second inverter may be electrically connected between the first voltage line and the second voltage line. The second voltage may be higher than the third voltage.

In some embodiments, the precharge circuit may include a fourth transistor and a fifth transistor connected in series between the first node and the second node, a sixth transistor electrically connected between a node between the fourth transistor and the fifth transistor and the first voltage, and a seventh transistor electrically connected between the node between the fourth transistor and the fifth transistor and the second voltage.

In some embodiments, a gate of the first transistor may selectively receive an enable voltage, a disable voltage, or a bias voltage between the enable voltage and the disable voltage.

In some embodiments, during the first time period, the gate of the first transistor may receive the enable voltage, and the precharge circuit may transfer the first voltage to the first node and the second node. During the second time period after the first time period, the gate of the first transistor may receive the disable voltage, and the precharge circuit may transfer the second voltage to the first node and the second node. During a third time period after the second time period, the gate of the first transistor may receive the bias voltage. During a fourth time period after the third time period, the gate of the first transistor may receive the third voltage, and the second transistor may be turned on while the third transistor is turned off. During a fifth time period after the fourth time period, the third transistor may be turned on while the second transistor is turned on.

In some embodiments, during a sixth time period between the first time period and the second time period, the gate of the first transistor may receive the bias voltage, and the precharge circuit may transfer the second voltage to the first node and the second node.

According to some embodiments, a memory device including a first memory cell, a first bitline electrically connected to the first memory cell, and a sense amplifier circuit may be provided. The sense amplifier circuit may include a first node, a second node, a first transistor electrically connected between the first bitline and the first node, a first inverter whose input terminal is electrically connected to the first node, and a second inverter whose input terminal is electrically connected to the second node. The sense amplifier circuit may transfer a first voltage to the first node and the second node while the first transistor is turned on during the first time period, transfer a second voltage higher than the first voltage to the first node and the second node while the first transistor is turned off during a second time period after the first time period, connect the first bitline and the first node through the first transistor during a third time period after the second time period, connect an output terminal of the first inverter and the input terminal of the second inverter during a fourth time period after the third time period, and connect the first inverter and the second inverter as a cross-coupled latch while the first transistor is turned off during a fifth time period after the fourth time period.

In some embodiments, the memory device may further include a second memory cell, and a second bitline electrically connected to the second memory cell to form a complementary bitline pair with the first bitline. The sense amplifier circuit may further include a second transistor electrically connected between the second bitline and the second node.

In some embodiments, the sense amplifier circuit may electrically connect the first bitline and the first node to the first transistor, and transfer the second voltage to the first node and the second node, during a sixth time period between the first time period and the second time period.

In some embodiments, the sense amplifier circuit may apply an enable voltage to a gate of the first transistor to turn on the first transistor during the first time period, apply a disable voltage to the gate of the first transistor to turn off the first transistor during the second time period and the fifth time period, and apply a third voltage between the enable voltage and the disable voltage to the gate of the first transistor during the third time period and the sixth time period.

In some embodiments, the sense amplifier circuit may apply the bias voltage to the gate of the first transistor during the fourth time period.

According to some embodiments, a sensing method of a memory device may be provided. The sensing method may include precharging a bitline with a first voltage, precharging a first node with a second voltage higher than the first voltage and sharing charges between a memory cell and the bitline, transferring charges between the first node and the bitline, connecting a first inverter whose input terminal is electrically connected to the first node with a second inverter whose input terminal is electrically connected to the second node as a single-ended amplifier, and connecting the first inverter and the second inverter as a cross-coupled latch and sensing data of the memory cell based on a voltage difference between the first node and the second node. The connecting the first inverter and the second inverter as the single-ended amplifier may include performing a pre-sensing operation prior to sensing the data of the memory cell to increase the voltage difference between the first node and the second node.

In some embodiments, the sensing method may further include, after precharging the bitline with the first voltage, storing offset information of a transistor configured to connect the first node and the bitline. The transferring the charges between the first node and the bitline may include transferring the charges through the transistor.

In some embodiments, the sharing the charges between the memory cell and the bitline may include electrically isolating the bitline from the first node.

In some embodiments, the sensing the data of the memory cell may include electrically isolating the bitline from the first node.

DETAILED DESCRIPTION

Figure 1:
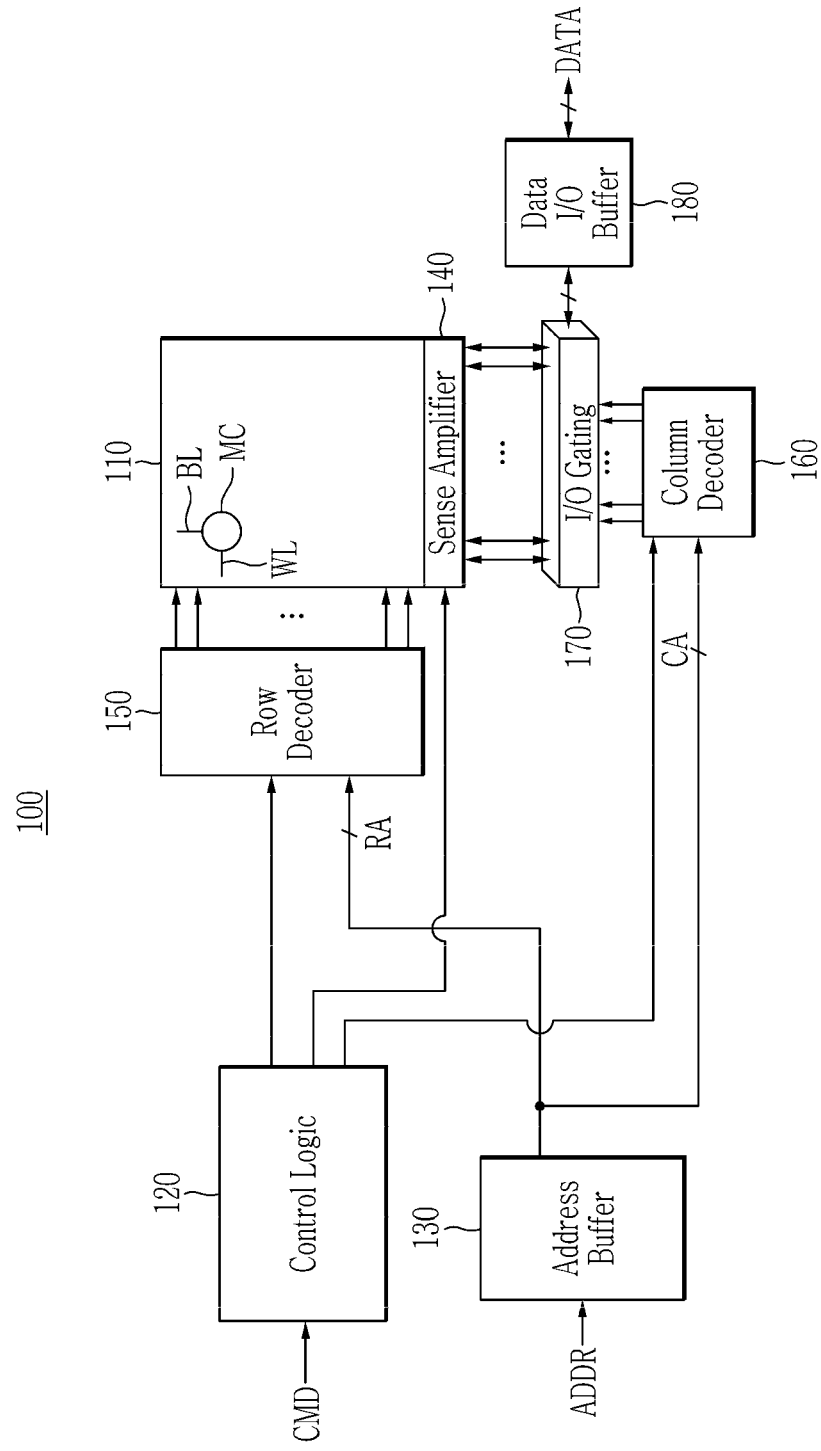
FIG. 1 is a block diagram showing an example of a memory device according to some embodiments.

In the following detailed description, only certain embodiments of the present invention have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification. The sequence of operations or steps is not limited to the order presented in the claims or figures unless specifically indicated otherwise. The order of operations or steps may be changed, several operations or steps may be merged, a certain operation or step may be divided, and a specific operation or step may not be performed.

As used herein, the singular forms "a" and "an" are intended to include the plural forms as well, unless the context clearly indicates otherwise. Although the terms first, second, and the like may be used herein to describe various elements, components, steps and/or operations, these terms are only used to distinguish one element, component, step or operation from another element, component, step, or operation.

FIG. 1 is a block diagram showing an example of a memory device according to some embodiments.

Referring to FIG. 1, a memory device 100 may include a memory cell array 110, a control logic circuit 120, an address buffer 130, a sense amplifier 140, a row decoder 150, a column decoder 160, an input/output (I/O) gating circuit 170, and a data I/O buffer 180. In some embodiments, the memory device 100 may be a dynamic random-access memory (DRAM).

The memory cell array 110 may include a plurality of rows, a plurality of columns, and a plurality of memory cells MC arranged at intersections of the rows and the columns. The rows may be defined by a plurality of wordlines WL, and the columns may be defined by a plurality of bitlines BL.

The control logic circuit 120 may control an operation of the memory device 100. For example, the control logic circuit 120 may generate a control signal so that the memory device 100 may perform a read operation, a write operation, or a refresh operation. In some embodiments, the control logic circuit 120 may generate the control signal by decoding a command CMD received from a memory controller. In some embodiments, the control logic circuit 120 may transfer the control signals to the sense amplifier 140, the row decoder 150, and the column decoder 160.

The address buffer 130 may receive an address ADDR provided from the memory controller. The address ADDR may include a row address RA indicating a row of the memory cell array 110 and a column address CA indicating a column of the memory cell array 110. The row address RA may be provided to the row decoder 150, and the column address CA may be provided to the column decoder 160.

The row decoder 150 may select a row to be activated from among the rows of the memory cell array 110 based on the row address RA. The row decoder 150 may apply a driving voltage to a wordline WL corresponding to the row to be activated.

The column decoder 160 may select a column to be activated from among the columns of the memory cell array 110 based on the column address CA. The column decoder 160 may activate the sense amplifier 140 corresponding to the column address CA through the I/O gating circuit 170. The sense amplifier 140 may be connected to the bitline BL of the memory cell array 110. The sense amplifier 140 may sense a voltage of the bitline BL and output the sensed voltage. In some embodiments, the I/O gating circuit 170 may gate I/O data, and may include a data latch that stores data read from the memory cell array 110 and a write driver that writes data to the memory cell array 110. The data read from the memory cell array 110 may be sensed by the sense amplifier 140 and stored in the I/O gating circuit 170 (e.g., the data latch).

In some embodiments, the data read from the memory cell array 110 (e.g., the data stored in the data latch) may be provided to the memory controller through the data I/O buffer 180. The data to be written into the memory cell array 110 may be provided to the data I/O buffer 180 from the memory controller, and the data provided to the data I/O buffer may be provided to the I/O gating circuit 170.

Figure 2:
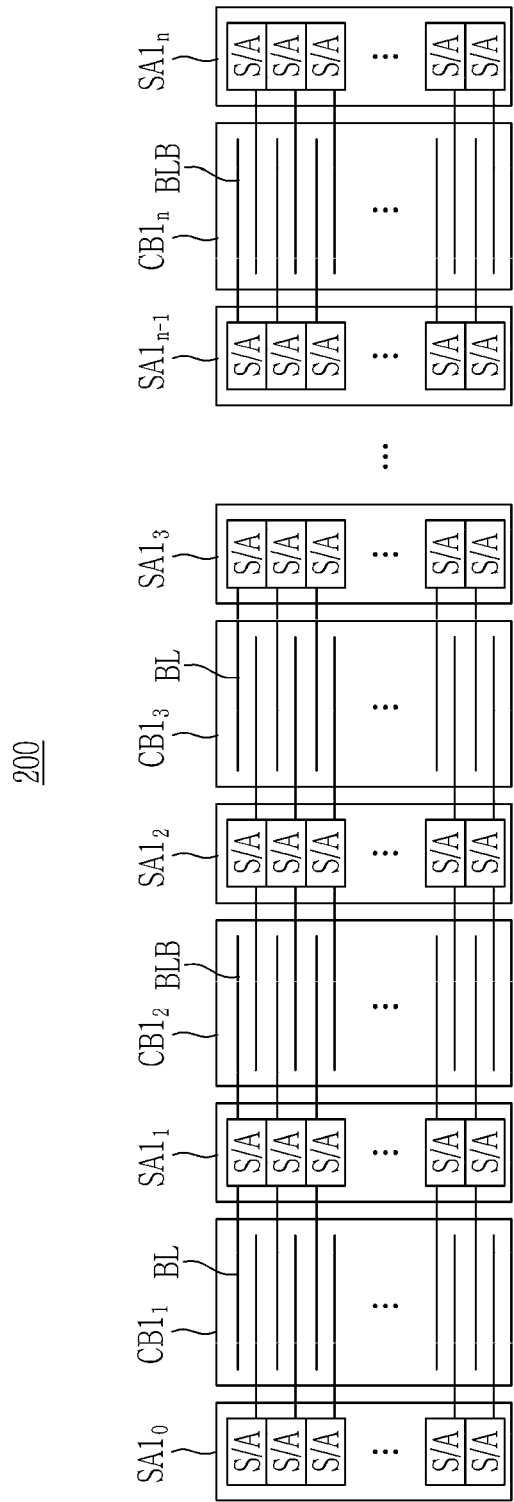
FIG. 2 and FIG. 4 each are a drawing showing an example of a memory cell array and a sense amplifier in a memory device according to some embodiments.
Figure 3:
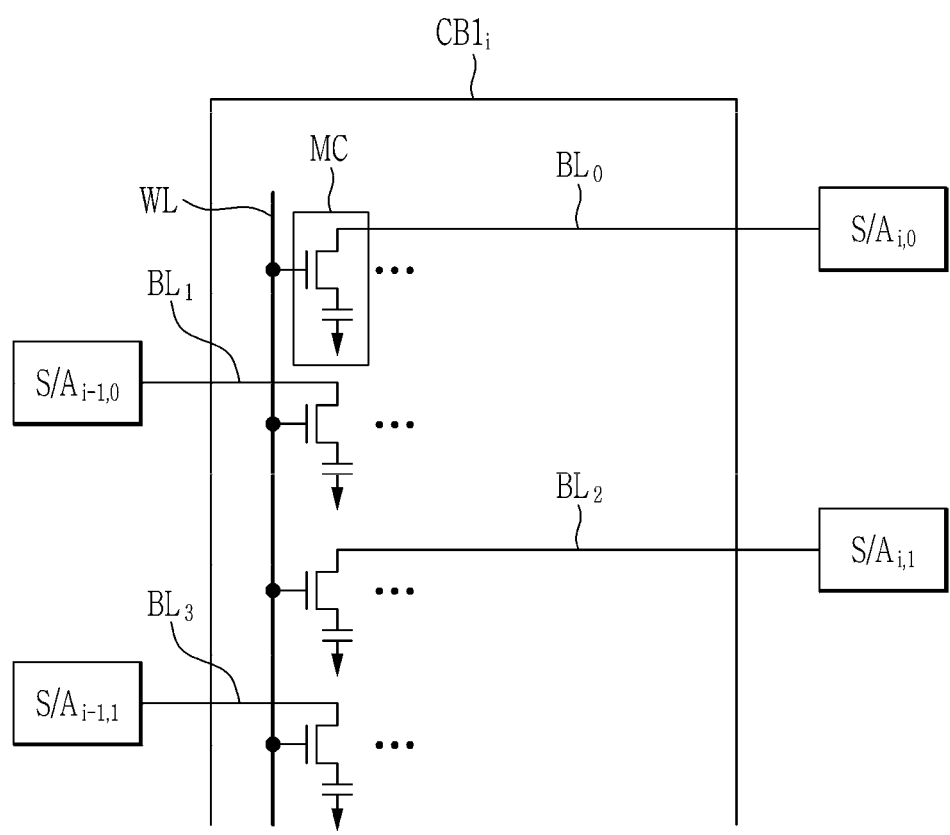
FIG. 3 is a drawing showing an example of a connection between a memory cell and a sense amplifier circuit in a memory device according to some embodiments.
Figure 4:
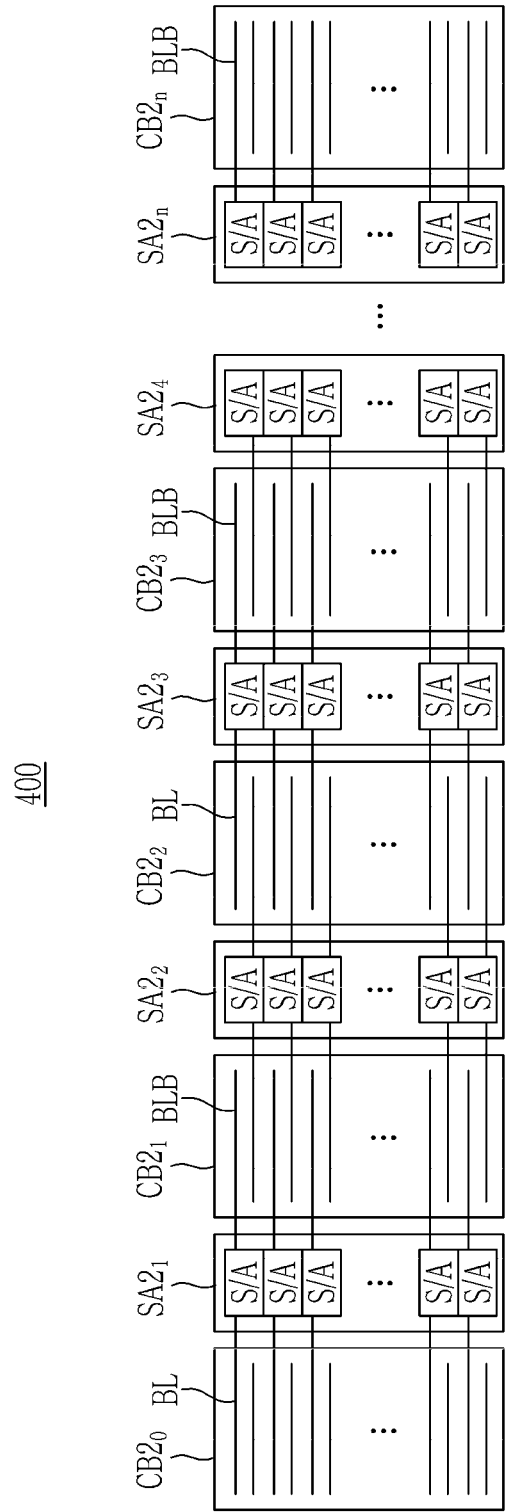

FIG. 2 and FIG. 4 each are a drawing showing an example of a memory cell array and a sense amplifier in a memory device according to some embodiments, FIG. 3 is a drawing showing an example of a connection between a memory cell and a sense amplifier circuit in a memory device according to some embodiments.

Referring to FIG. 2, a memory cell array 200 may include a plurality of memory cell blocks $CB1_1$, $CB1_2$, $CB1_3$ . . . $CB1_n$, and a plurality of sense amplifier blocks $SA1_0$, $SA1_1$, $SA1_2$ . . . $SA1_{n-1}$, $SA1_n$. Here, n is a natural number. Each sense amplifier block $SA1_i$ may correspond to two adjacent memory cell blocks $CB1_i$ and $CB1_{i+1}$ among the memory cell blocks $CB1_1$-$CB1_n$, and may be connected to the two adjacent memory cell blocks $CB1_i$ and $CB1_{i+1}$. Here, i is an integer between 1 and (n−1).

Each memory cell block $CB1_i$ may include a plurality of bitlines BL extending in a predetermined direction (e.g., a column direction). A plurality of memory cells may be connected to each bitline BL. The memory cell block $CB1_i$ may further include a plurality of wordlines extending in a different direction (e.g., a row direction). The memory cells connected to each bitline BL may be connected to a plurality of wordlines, respectively. In some embodiments, as shown in FIG. 2, some of the memory cell blocks $CB1_1$-$CB1_n$ may include complementary bitlines BLB as the bitlines. In this case, the memory cell block in which the bitlines BL are formed and the memory cell block in which the complementary bitlines BLB are formed may be alternately disposed, and the bitline BL and the complementary bitline BLB may form a complementary bitline pair.

The sense amplifier block $SA1_i$ may be connected to some bitlines BL of one memory cell block $CB1_i$ and some complementary bitlines BLB of the other memory cell block $CB1_{i+1}$. In some embodiments, the sense amplifier block $SA1_i$ may be connected to the odd numbered bitlines BL of the memory cell block $CB1_i$ and the odd numbered complementary bitline BLB of the memory cell block $CB1_{i+1}$. In this case, the even numbered bitline BL of the memory cell block $CB1_i$ may be connected to the other sense amplifier block $SA1_{i-1}$, and the even numbered complementary bitline BLB of the memory cell block $CB1_{i+1}$ may be connected to the other sense amplifier block $SA1_{i+1}$. In some other embodiments, the sense amplifier block $SA1_i$ may be connected to even numbered bitlines BL of the memory cell block $CB1_i$ and the even numbered complementary bitlines BLB of the memory cell block $CB1_{i+1}$.

In some embodiments, the sense amplifier block $SA1_0$ positioned at one end may be connected to the bitlines BL of one memory cell $CB1_1$, and the sense amplifier block $SA1_n$ positioned at the other end may be connected to the complementary bitlines BLB of one memory cell $CB1_n$.

The sense amplifier block $SA1_i$ may include a plurality of sense amplifiers S/A. The sense amplifiers S/A may correspond to some bitlines BL of the memory cell block $CB1_i$, respectively, and may correspond to some complementary bitlines BLB of the other memory cell block $CB1_{i+1}$, respectively. Each sense amplifier S/A may be connected to a corresponding one among some bitlines (e.g., odd numbered bitlines) BL of the memory cell block $CB1_i$ and a corresponding one among some complementary bitlines (e.g., odd numbered complementary bitlines) BLB of the memory cell block $CB1_{i+1}$. As shown in FIG. 3, bitlines $BL_0$ and $BL_2$ in a cell array block $CB1_i$ may be respectively connected to sense amplifiers $S/A_{i,0}$ and $S/A_{i,2}$ of a sense amplifier block $SA1_i$, respectively, and bitlines $BL_1$, and $BL_3$ may be connected to sense amplifiers $S/A_{i-1,0}$ and $S/A_{i-1,1}$ of a sense amplifier block $SA1_{i-1}$, respectively. For convenience of description, FIG. 3 shows one wordline WL and memory cells MC connected to the wordline WL. Further, although FIG. 3 shows that each memory cell MC includes a transistor and a capacitor, a structure of the memory cell (MC) is not limited thereto.

Referring to FIG. 4, in some other embodiments, a memory cell array 400 may include a plurality of memory cell blocks $CB2_0$, $CB2_1$, $CB2_2$ . . . $CB2_n$, and a plurality of sense amplifier blocks $SA2_1$, $SA2_2$, $SA2_3$ . . . $SA2_n$. Here, n is a natural number. Each sense amplifier block $SA2_i$ may correspond to two adjacent memory cell blocks $CB2_{i-1}$ and $CB2_i$ among the memory cell blocks $CB2_0$-$CB2_n$, and may be connected to the two adjacent memory cell blocks $CB2_{i-1}$ and $CB2_i$. Here, i is an integer between 1 and n.

The sense amplifier block $SA2_i$ may be connected to some bitlines BL of one memory cell block $CB2_{i-1}$ and some complementary bitlines BLB of the other memory cell block $CB2_i$. In some embodiments, the sense amplifier block $SA2_i$ may be connected to the odd numbered bitlines BL of the memory cell block $CB2_{i-1}$ and the odd numbered complementary bitlines BLB of the memory cell block $CB2_i$. In this case, the even numbered bitline BL of the memory cell block $CB2_{i-1}$ may be connected to the other sense amplifier block $SA2_{i-1}$, and the even numbered complementary bitline BLB of the memory cell block $CB2_i$ may be connected to the other sense amplifier block $SA2_{i+1}$. In some other embodiments, the sense amplifier block $SA2_i$ may be connected to the even numbered bitlines BL of the memory cell block $CB2_{i-1}$ and the even numbered complementary bitlines BLB of the memory cell block $CB2_i$.

In some embodiments, some bitlines (BL and BLB) of the memory cell blocks $CB2_0$ and $CB2_n$ positioned at both ends may be dummy bitlines, and may be not connected to a sense amplifier block. For example, the sense amplifier block may not be connected to the even numbered bitlines BL of the memory cell block $CB2_0$ and the odd numbered complementary bitlines BLB of the memory cell block $CB2_n$.

Figure 5:
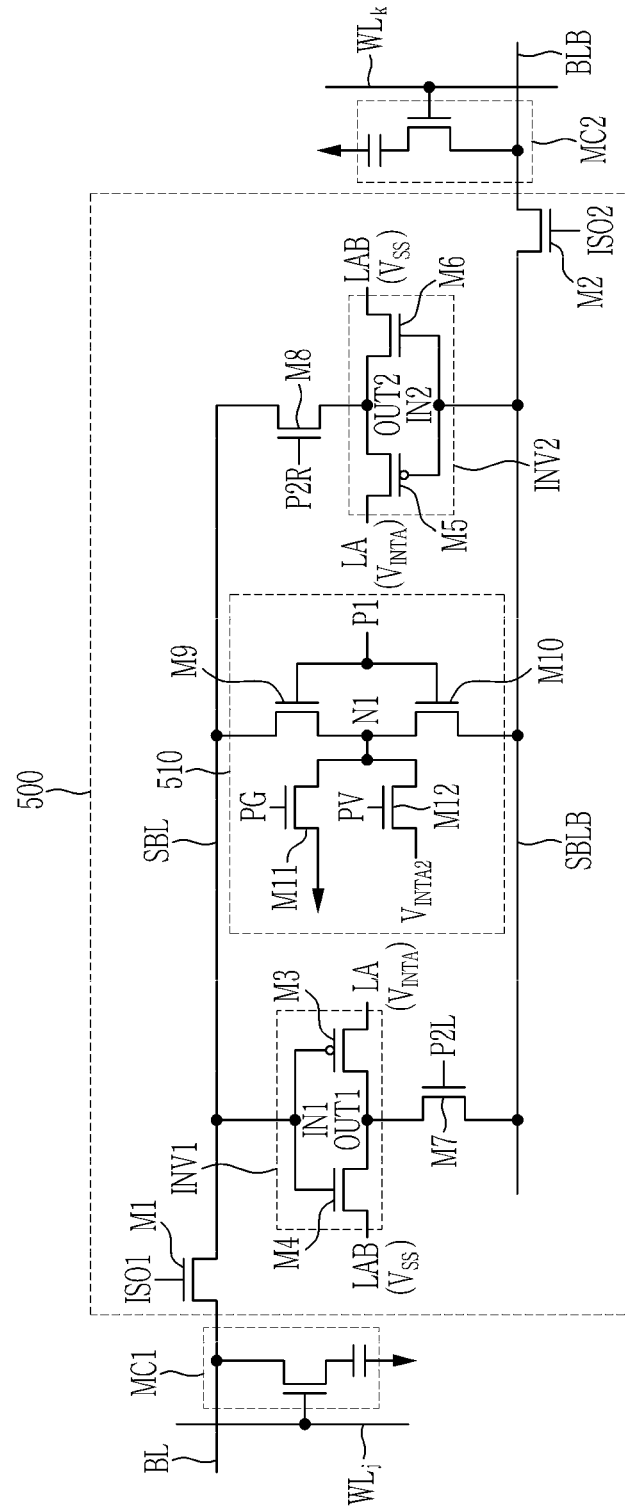
FIG. 5 is a drawing showing an example of a sense amplifier circuit according to some embodiments.
Figure 6:
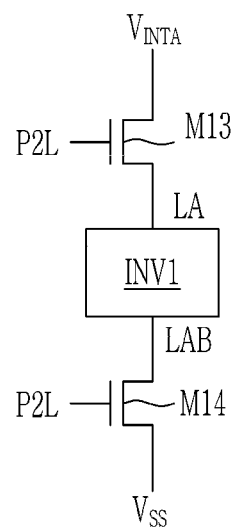
FIG. 6 is a drawing showing an example of a voltage supply circuit of one inverter shown in FIG. 5.
Figure 7:
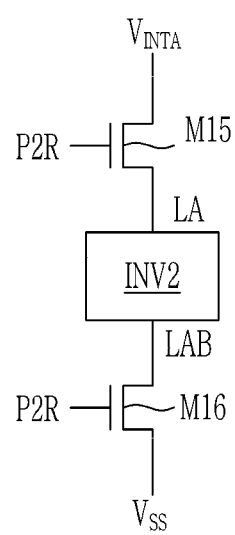
FIG. 7 is a drawing showing an example of a voltage supply circuit of another inverter shown in FIG. 5.

FIG. 5 is a drawing showing an example of a sense amplifier circuit according to some embodiments, FIG. 6 is a drawing showing an example of a voltage supply circuit of one inverter shown in FIG. 5, and FIG. 7 is a drawing showing an example of a voltage supply circuit of another inverter shown in FIG. 5. A sense amplifier circuit 500 shown in FIG. 5 may correspond to a sense amplifier of a sense amplifier block shown in FIG. 2 or FIG. 4.

Referring to FIG. 5, the sense amplifier circuit 500 may be connected to a bitline BL and a complementary bitline BLB. A plurality of memory cells may be connected to the bitline BL, and a plurality of wordlines may be connected to the memory cells, respectively. In addition, the memory cells may be connected to the complementary bitline BLB, and a plurality of wordlines may be connected to the memory cells, respectively. In some embodiments, the sense amplifier circuit 500 may be connected to any one of the bitline BL and the complementary bitline BLB. For example, the sense amplifier circuit 500 of the sense amplifier blocks $SA1_0$ and $SA1_n$ positioned at both ends shown in FIG. 2 may be connected to any one of the bitline BL and the complementary bitline BLB. For convenience of description, FIG. 5 shows a memory cell MC1 connected to the bitline BL, one wordline $WL_j$ connected to the memory cell MC1, a memory cell MC2 connected to the complementary bitline BLB, and one wordline $WL_k$ connected to the memory cell MC2. Further, although FIG. 5 shows that each of the memory cells MC1 and MC2 includes a transistor and a capacitor, structures of the memory cells MC1 and MC2 are not limited thereto.

The sense amplifier circuit 500 may include inverters INV1 and INV2, a precharge circuit 510, and transistors M1, M2, M7, and M8. In some embodiments, transistors M1-M12 showing in FIG. 5 may be metal oxide semiconductor (MOS) transistors. In some embodiments, the transistors M1, M2, M4, and M6-M12 may be N-channel transistors, e.g., NMOS transistors, and the transistors M3 and M5 may be P-channel transistors, e.g., PMOS transistors. The transistors M1-M12 may each have a source, a drain and a gate as a first input terminal, a second input terminal, and a control terminal.

The transistor M1 may be used to electrically isolate the sense amplifier circuit 500 from the bitline BL. The transistor M1 may be connected between the bitline BL (e.g., one end of the bitline BL) and an internal node (or first node) SBL corresponding to the bitline BL in the sense amplifier circuit 500, and may operate in response to a control signal ISO1. For example, in the transistor M1, the source may be connected to the bitline BL, the drain may be connected to the internal node SBL, and the control signal ISO1 may be applied to the gate. The control signal ISO1 may have an enable level (e.g., high level, enable voltage) for turning on the transistor M1 or a disable level (e.g., a low level, disable voltage) for turning off the transistor M1. Further, the control signal ISO1 may have a bias voltage between a voltage with the enable level and a voltage with the disable level.

In some embodiments, when the sense amplifier circuit 500 is connected to the bitline BL of one memory cell MC1 and the complementary bitline BLB of the other memory cell MC2, the sense amplifier circuit 500 may further include the transistor M2. The transistor M2 may be used to electrically isolate the sense amplifier circuit 500 from the complementary bitline BLB. The transistor M2 may be connected between the complementary bitline BLB (e.g., one end of the complementary bitline BLB) and an internal node (or second node) SBLB corresponding to the complementary bitline BLB in the sense amplifier circuit 500, and may operate in response to a control signal ISO2. For example, in the transistor M2, the source may be connected to the complementary bitline BLB, the drain may be connected to the internal node SBLB, and the control signal ISO2 may be applied to the gate. The control signal ISO2 may have an enable level (e.g., high level) for turning on the transistor M2 or a disable level (e.g., low level) for turning off the transistor M2. Further, the control signal ISO2 may have a bias voltage between a voltage with the enable level and a voltage with the disable level.

The inverter (or first inverter) INV1 may be connected between a high voltage line LA and a low voltage line LAB, and may provide a supply voltage $V_{INTA}$ of the high voltage line LA or a supply voltage $V_{SS}$ of the low voltage line LAB to an output terminal OUT1 in accordance with a voltage of an input terminal IN1. The inverter (or second inverter) INV2 may be connected between the high voltage line LA and the low voltage line LAB, and may provide the supply voltage $V_{INTA}$ of the high voltage line LA or the supply voltage $V_{SS}$ of the low voltage line LAB to an output terminal OUT2 in accordance with a voltage of an input terminal IN2. The input terminal IN1 of the inverter INV1 may be connected to the internal node SBL, and the input terminal IN2 of the inverter INV2 may be connected to the internal node SBLB. In some embodiments, the inverters INV1 and INV2 may be complementary MOS (CMOS) inverters. In this case, the inverter INV1 may include the transistor M3 connected between the high voltage line LA and the output terminal OUT1 and the transistor M4 connected between the output terminal OUT1 and the low voltage line LAB. Further, the inverter INV2 may include the transistor M5 connected between the high voltage line LA and the output terminal OUT2 and the transistor M6 connected between the output terminal OUT2 and the low voltage line LAB. The gates of the transistors M3 and M4 may be connected to the input terminal IN1, i.e., the internal node SBL, and the gates of the transistors M5 and M6 may be connected to the input terminal IN2, i.e., the internal node SBLB.

The transistor M7 may be connected between the output terminal OUT1 of the inverter INV1 and the internal node SBLB, and may operate in response to a control signal P2L. The transistor M8 may be connected between the output terminal OUT2 of the inverter INV2 and the internal node SBL, and may operate in response to a control signal P2R. For example, in the transistor M7, the drain may be connected to the output terminal OUT1, the source may be connected to the internal node SBLB, and the gate may receive the control signal P2L. Further, in the transistor M8, the source may be connected to the output terminal OUT2, the drain may be connected to the internal node SBL, and the gate may receive the control signal P2R. Accordingly, when the transistors M7 and M8 are turned on, the two inverters INV1 and INV2 may form a cross-coupled latch.

The precharge circuit 510 may transfer a first voltage to the internal nodes SBL and SBLB in response to a control signal PG during a first period to precharge the internal nodes SBL and SBLB with the first voltage, or may transfer a second voltage $V_{INTA2}$ to the internal nodes SBL and SBLB in response to a control signal PV during a second period to precharge the internal nodes SBL and SBLB with the second voltage $V_{INTA2}$. In some embodiments, the first voltage may be a ground voltage, and the second voltage $V_{INTA2}$ may be a voltage higher than the supply voltage $V_{INTA}$ of the high voltage line LA of the inverter INV1 and INV2. In some embodiments, the precharge circuit 510 may include the transistors M9, M10, M11 and M12.

The transistors M9 and M10 may be connected in series between the internal node SBL and the internal node SBLB, and may operate in response to a control signal P1. For example, the drain of the transistor M9 may be connected to the internal node SBL, the source of the transistor M10 may be connected to the internal node SBLB, and the source of the transistor M9 and the drain of the transistor M10 may be connected to a node N1. The gates of the transistors M9 and M10 may receive the control signal P1. The transistor M11 may be connected between the node N1, which is a contact between the source of the transistor M9 and the drain of the transistor M10, and a ground terminal, and the transistor M12 may be connected between the node N1 and a line supplying the voltage $V_{INTA2}$. The transistor M11 may transfer the ground voltage to the node N1 in response to the control signal PG, and the transistor M12 may transfer the voltage $V_{INTA2}$ to the node N1 in response to the control signal PV. For example, in the transistor M11, the drain may be connected to the node N1, the source may be connected to the ground terminal, and the gate may receive the control signal PG. Further, in the transistor M12, the drain may be connected to the line supplying the voltage $V_{INTA2}$, the source may be connected to the node N1, and the gate may receive the control signal PV.

In some embodiments, as shown in FIG. 6, a transistor M13 may be connected between the high voltage line LA of inverter INV1 and a node transferring the high voltage $V_{INTA}$, and a transistor M14 may be connected between the low voltage line LAB of inverter the INV1 and a node transferring the low voltage $V_{SS}$. When transistors M13 and M14 are turned on in response to a control signal, the high voltage $V_{INTA}$ and the low voltage $V_{SS}$ may be supplied to the high voltage line LA and the low voltage line LAB of the inverter INV1, respectively. In some embodiments, the control signal P2L delivered to the gate of the transistor M7 may be delivered to gates of the transistors M13 and M14. In some embodiments, the high voltage $V_{INTA}$ may be an internal voltage of a memory device, and the low voltage $V_{SS}$ may be the ground voltage. In some embodiments, the high voltage $V_{INTA}$ may be equal to the high level of the control signal, and the low voltage $V_{SS}$ may be equal to the low level of the control signal.

In some embodiments, as shown in FIG. 7, a transistor M15 may be connected between the high voltage line LA of inverter INV2 and a node transferring the high voltage $V_{INTA}$, and a transistor M16 may be connected between the low voltage line LAB of inverter the INV2 and a node transferring the low voltage $V_{SS}$. When transistors M15 and M16 are turned on in response to a control signal, the high voltage $V_{INTA}$ and the low voltage $V_{SS}$ may be supplied to the high voltage line LA and the low voltage line LAB of the inverter INV2, respectively. In some embodiments, the control signal P2R delivered to the gate of the transistor M8 may be delivered to gates of the transistors M15 and M16.

In some embodiments, the sense amplifier circuit 500 may receive the control signals ISO1, ISO2, P1, P2L, and P2R from a memory controller (e.g., 1230 in FIG. 12) or a control logic circuit (e.g., 120 in FIG. 1).

Figure 8:
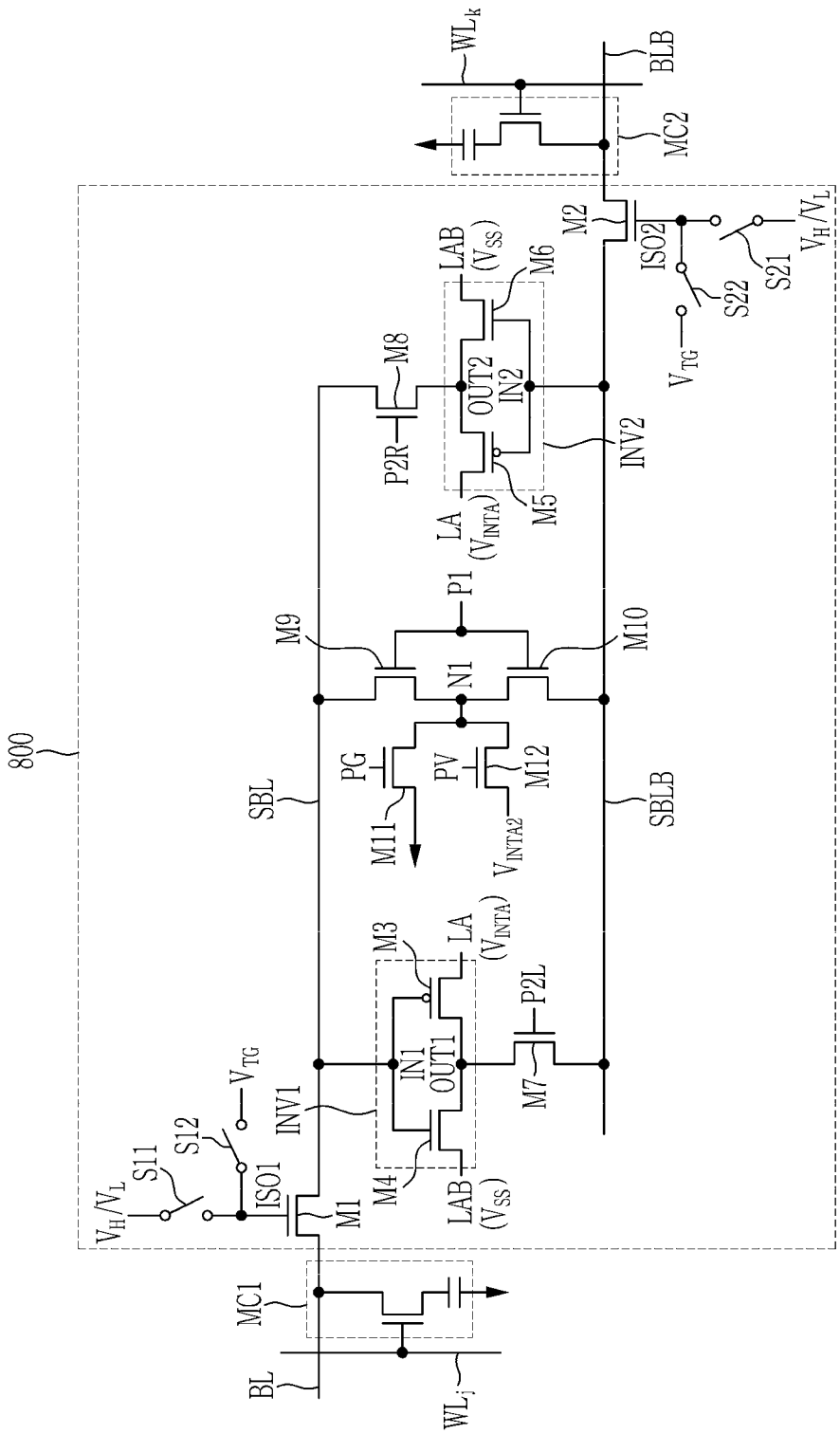
FIG. 8 is a drawing showing an example of a sense amplifier circuit according to some embodiments.

FIG. 8 is a drawing showing an example of a sense amplifier circuit according to some embodiments.

Referring to FIG. 8, a sense amplifier circuit 800 may include inverters INV1 and INV2, and transistors M1, M2, M7, M8, M9, M10, M11, and M12 as described with reference to FIG. 5. The sense amplifier circuit 800 may further include switches S11 and S12 connected to a gate of the transistor M1 and switches S21 and S22 connected to a gate of the transistor M2.

The switch S11 may be connected between a node transferring a voltage $V_H$ with an enable level and a voltage $V_L$ with a disable level and the gate of the transistor M1, and the switch S12 may be connected between a node transferring a bias voltage $V_{TG}$ and the gate of the transistor M1. In some embodiments, the voltage $V_H$ with the enable level may be equal to a voltage $V_{INTA}$ of a high voltage line LA, and the voltage $V_L$ with the disable level may be equal to a voltage $V_{SS}$ of a low voltage line LAB. Accordingly, when the switch S11 is turned on, a control signal ISO1 having the enable level or the disable level may be transferred to the gate of the transistor M1. When the switch S12 is turned on, the control signal ISO1 having the bias voltage $V_{TG}$ may be transferred to the gate of the transistor M1.

The switch S21 may be connected between a node transferring the voltage $V_H$ with the enable level and the voltage $V_L$ with the disable level and the gate of the transistor M2, and the switch S22 may be connected between a node transferring the bias voltage $V_{TG}$ and the gate of the transistor M2. Accordingly, when the switch S21 is turned on, a control signal ISO2 having the enable level or the disable level may be transferred to the gate of the transistor M2. When the switch S22 is turned on, the control signal ISO2 having the bias voltage $V_{TG}$ may be transferred to the gate of the transistor M2.

Next, a sensing method of a memory device is described with reference to FIG. 9 to FIG. 11.

Figure 9:
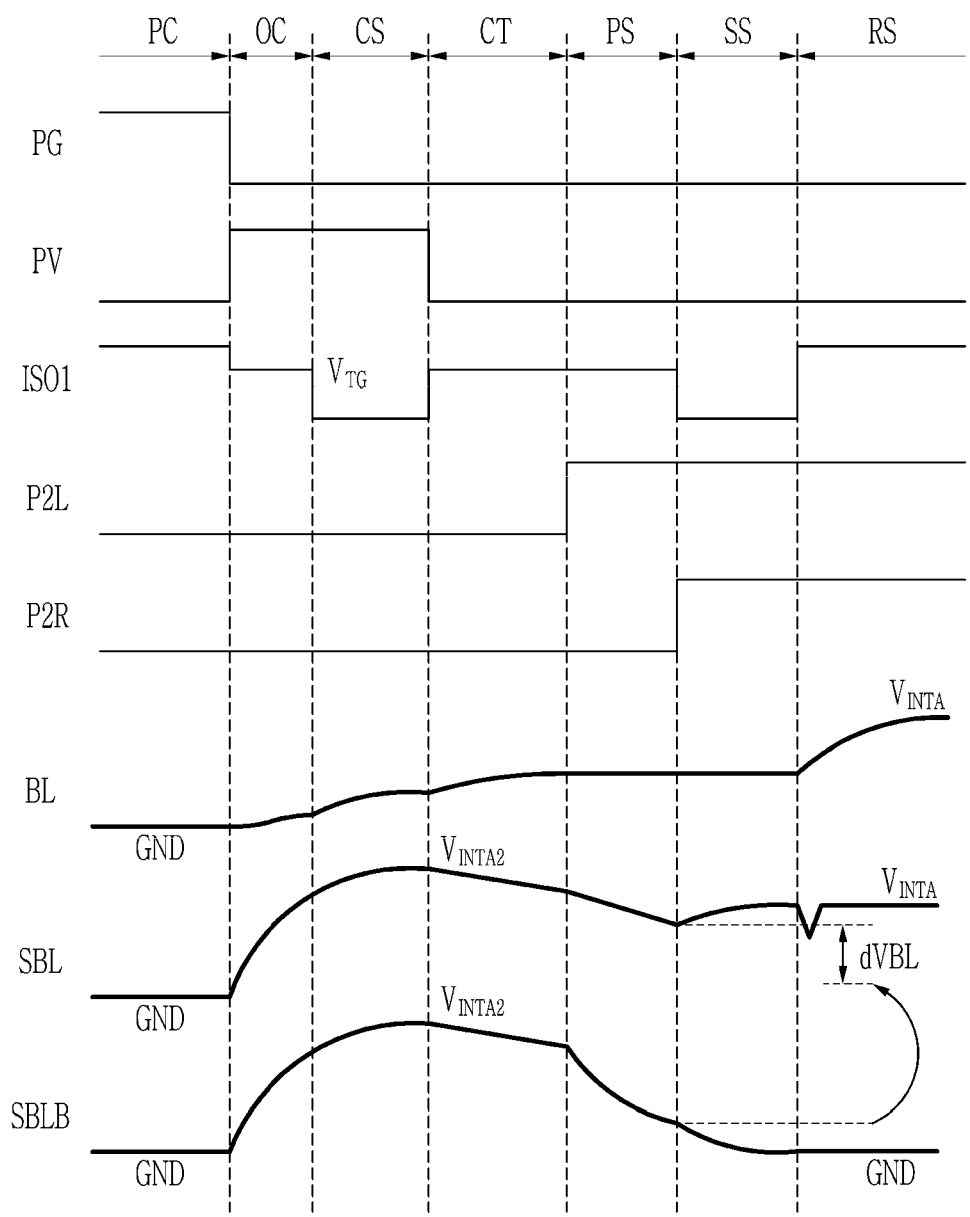
FIG. 9 and FIG. 11 each are a drawing showing an example of an operation timing of a sense amplifier circuit according to some embodiments.
Figure 10A:
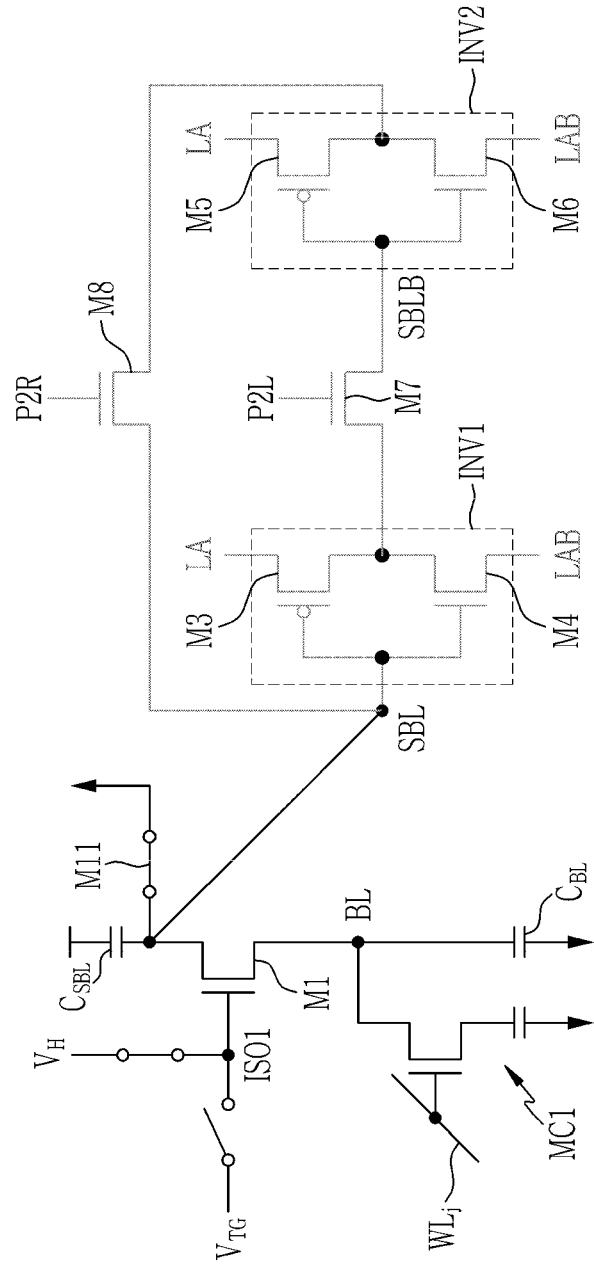
FIG. 10A, FIG. 10B, FIG. 10C, FIG. 10D, FIG. 10E, FIG. 10F, and FIG. 10G each are a drawing showing an example of an operation of a sense amplifier circuit according to an operation timing shown in FIG. 9.
Figure 10B:
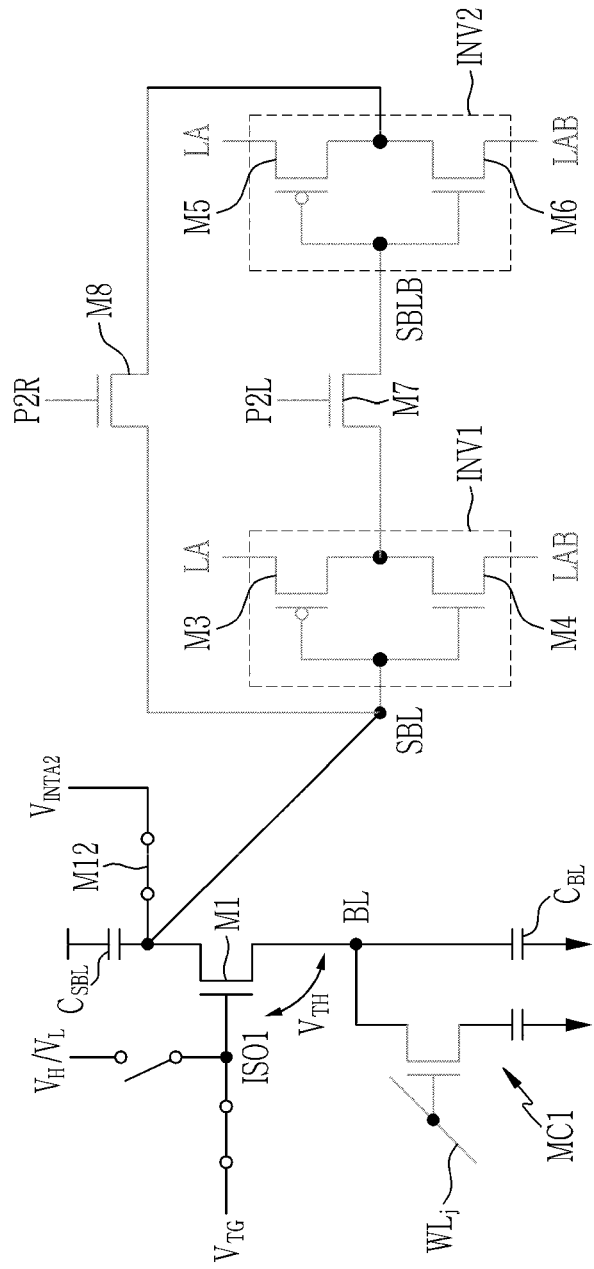
Figure 10C:
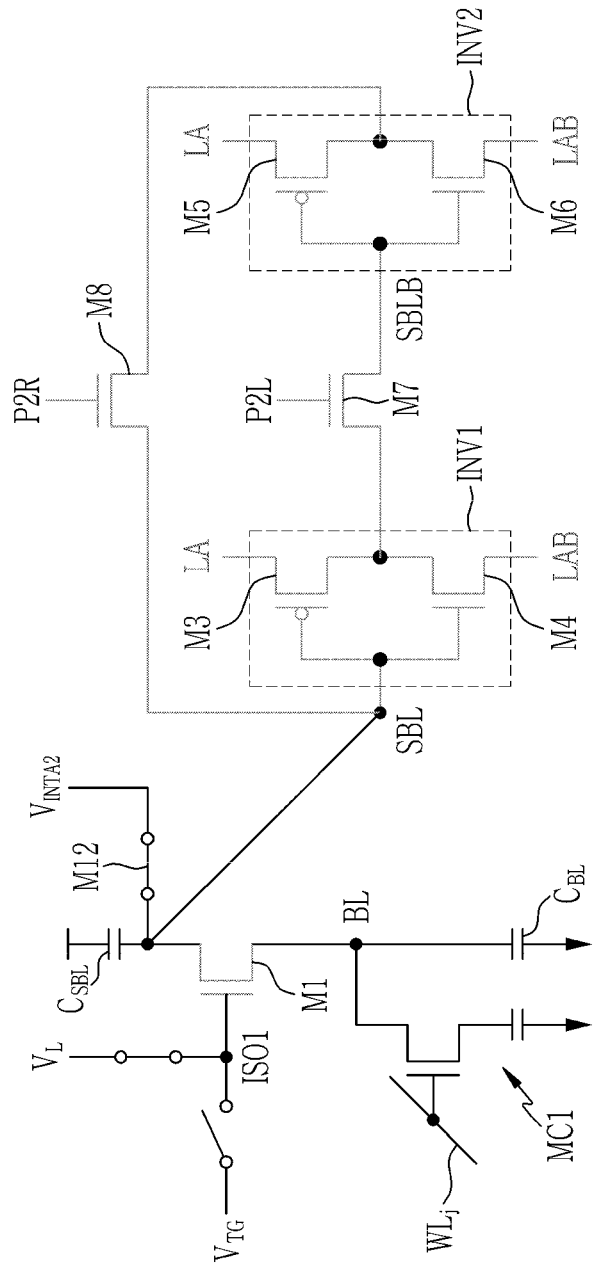
Figure 10D:
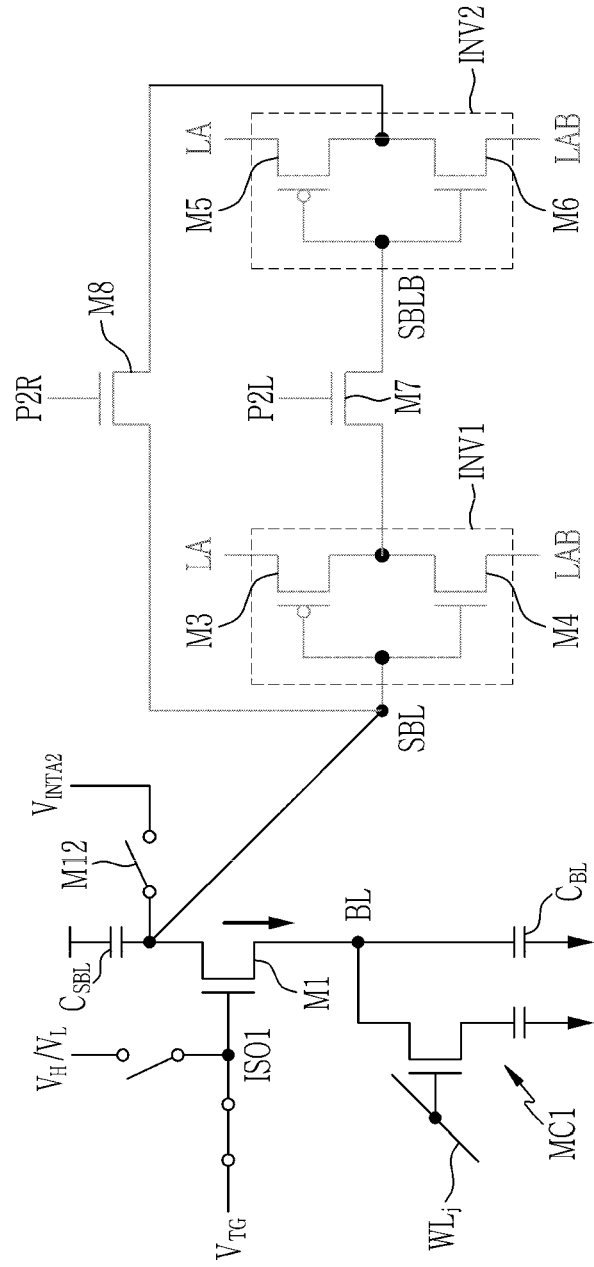
Figure 10E:
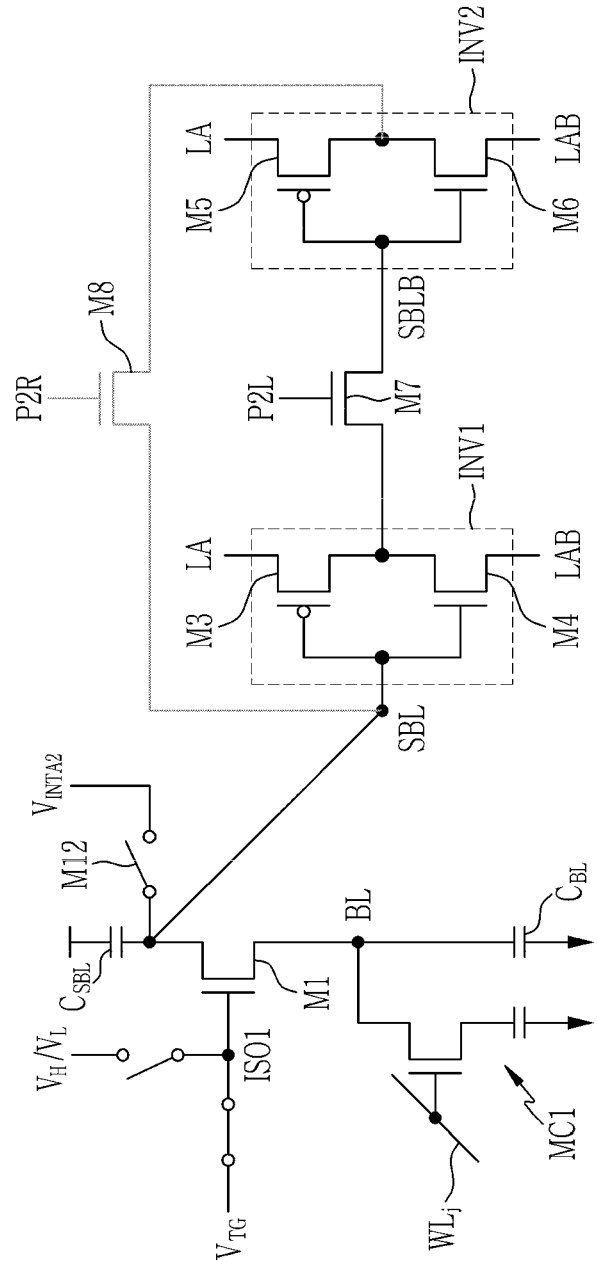
Figure 10F:
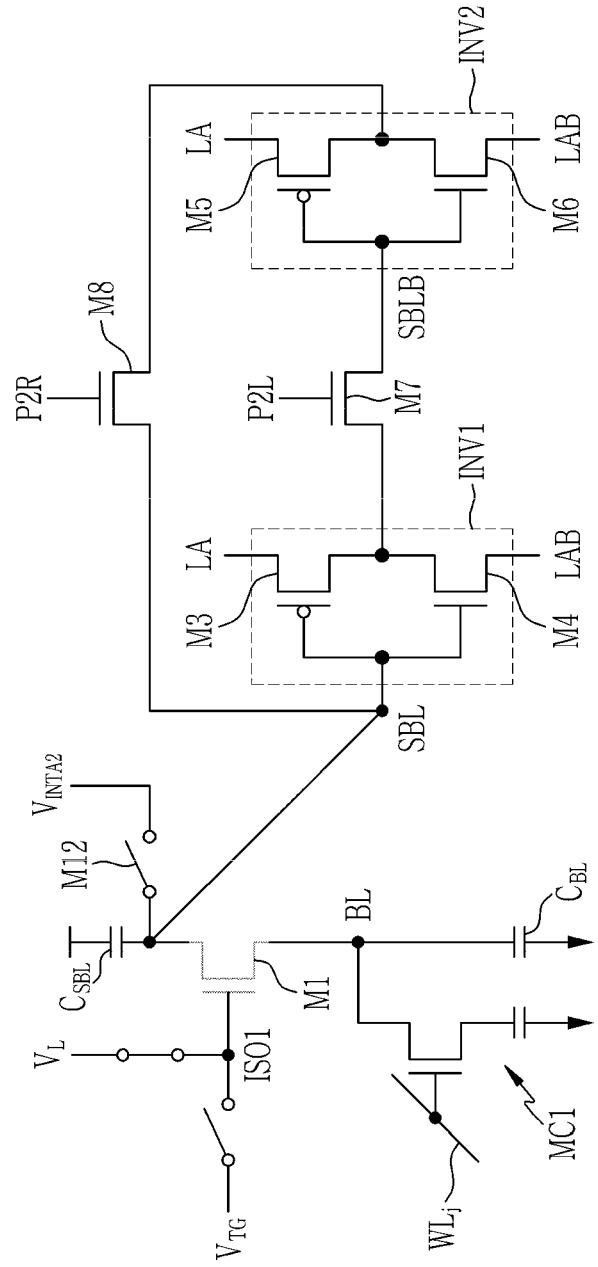
Figure 10G:
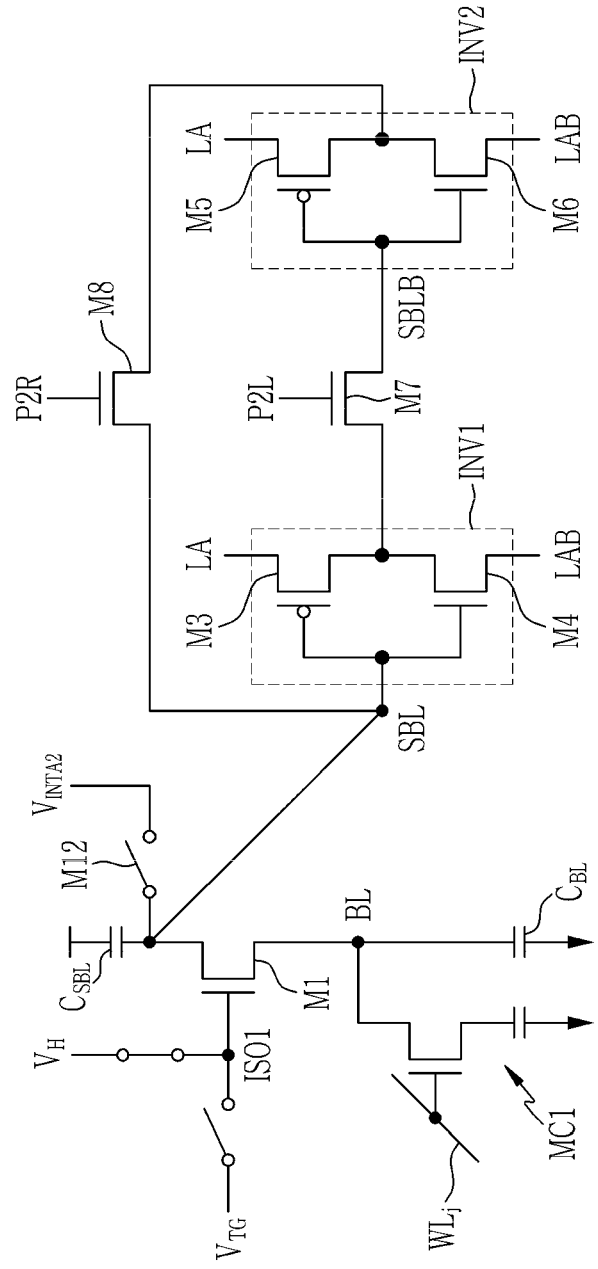
Figure 11:
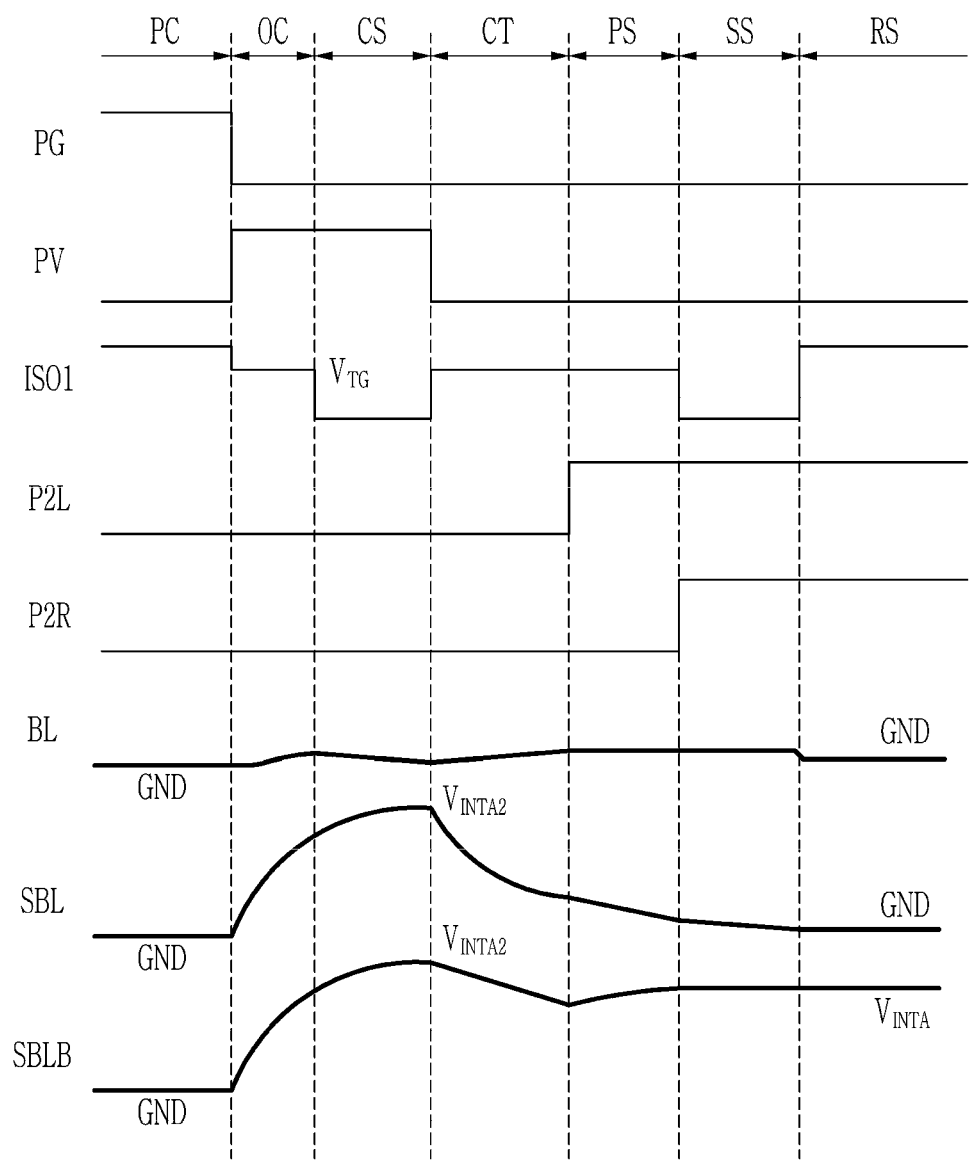

FIG. 9 and FIG. 11 each are a drawing showing an example of an operation timing of a sense amplifier circuit according to some embodiments, and FIG. 10A, FIG. 10B, FIG. 10C, FIG. 10D, FIG. 10E, FIG. 10F, and FIG. 10G each are a drawing showing an example of an operation of a sense amplifier circuit according to an operation timing shown in FIG. 9. It is assumed that data '1' is stored in a memory cell MC1 in FIG. 9, and data '0' is stored in the memory cell MC1 in FIG. 11.

Referring to FIG. 8, FIG. 9, and FIG. 10A, a sense amplifier circuit may perform a precharge operation PC for precharging a bitline BL with a ground voltage. During the precharge operation (or first period) PC, the sense amplifier circuit may apply the ground voltage to internal nodes SBL and SBLB and a bitline BL through a transistor M11. A control signal PG may have an enable level (e.g., high level), and the transistor M11 may be turned on in response to the enable level of the control signal PG. Further, the control signal P1 may have the enable level so that the transistors M9 and M10 may also be turned on. Then, the internal nodes SBL and SBLB of the sense amplifier circuit may be precharged with the ground voltage. That is, a capacitance component $C_{SBL}$ existing in the internal nodes SBL and SBLB may be precharged with the ground voltage. Furthermore, a control signal ISO1 may have an enable level $V_H$. In response to the enable level $V_H$ of the control signal ISO1, a transistor M1 may be turned on so that the bitline BL may be precharged with the ground voltage. That is, a capacitance component $C_{BL}$ existing in the bitline BL may be precharged with the ground voltage.

Referring to FIG. 10B, the sense amplifier circuit may perform an offset compensation operation OC for storing offset information of the transistor M1 by connecting the bitline BL and the internal node SBL through the transistor M1. During the offset compensation operation (or sixth period) OC, a voltage $V_{INTA2}$ may be applied to the internal nodes SBL and SBLB, and a bias voltage $V_{TG}$ may be applied to a gate of the transistor M1. In some embodiments, the voltage $V_{INTA2}$ may be a voltage higher than a supply voltage $V_{INTA}$ of a high voltage line LA of inverters INV1 and INV2. In some embodiments, the bias voltage $V_{TG}$ may be a voltage between a high-level voltage used as the enable level and a low-level voltage used as a disable level, and may be a voltage higher than a threshold voltage $V_{TH}$ of transistor M1. In some embodiments, the bias voltage $V_{TG}$ may be set in consideration of charge transfer in a charge transfer operation CT which will be described below. In the offset compensation operation OC, the control signal PG may have the disable level (e.g., low level), a control signal PV may have the enable level, and the control signal ISO1 may have the bias voltage $V_{TG}$. In response to the enable level of the control signal PV, a transistor M12 may be turned on so that the internal nodes SBL and SBLB may be charged by the internal voltage $V_{INTA2}$. Then, a voltage of the bitline BL may increase while the bitline BL is charged by a voltage of the internal node SBL, and the voltage of the bitline BL may be determined by the threshold voltage $V_{TH}$ of the transistor M1. The voltage of the bitline BL may be determined as, for example, ($V_{TG}$-$V_{TH}$). That is, the offset information determined by the threshold voltage $VT_H$ of the transistor M1 may be stored in the bitline BL. In some embodiments, when compensation of the threshold voltage $V_{TH}$ of the transistor M1 is not required, the offset compensation operation OC may be omitted.

Referring to FIG. 10C, when a wordline $WL_j$ is activated, the sense amplifier circuit may perform a charge sharing operation CS for sharing charges between the bitline BL and the memory cell MC1. During the charge sharing operation (or second period) CS, the sense amplifier circuit may turn off the transistor M1. The control signal ISO1 may have the disable level $V_L$, and the transistor M1 may be turned off in response to the disable level $V_L$ of the control signal ISO1, so that the bitline BL may be electrically isolated from the internal nodes SBL and SBLB of the sense amplifier circuit. Since a transistor of the memory cell MC1 is turned on by the activation of the wordline $WL_j$, the charges may be shared between a capacitor of the memory cell MC1 and the bitline BL. Accordingly, the voltage of the bitline BL may increase. In this case, since the bitline BL has been precharged to the ground voltage in the precharge operation PC, the voltage may increase by a larger width that in a case where the bitline BL has been precharged with an intermediate voltage between the high level and the low level. Meanwhile, the internal nodes SBL and SBLB may be continuously charged up to approximately the voltage $V_{INTA2}$ by the enable level of the control signal PV.

Referring to FIG. 10D, the sense amplifier circuit may perform a charge transfer operation CT for transferring charges between the bitline BL and the internal node SBL by connecting the bitline BL and the internal node SBL. During the charge transfer operation (or third period) CT, the sense amplifier circuit may apply the bias voltage $V_{TG}$ to the gate of the transistor M1. In some embodiments, the bias voltage $V_{TG}$ used in the charge transfer operation CT may be equal to the bias voltage $V_{TG}$ used in the offset compensation operation OC. To this end, the control signal ISO1 may have the bias voltage $V_{TG}$. Then, due to a voltage ($V_{TG}$-$V_B$L-$V_{TH}$) obtained by subtracting the voltage $V_{BL}$ of the bitline BL and the threshold voltage $V_{TH}$ of the transistor M1 from the bias voltage $V_{TG}$, charges (e.g., electrons) may be transferred from the bitline BL to the internal node SBL to decrease a voltage of the internal node SBL. Meanwhile, since the bitline BL has been charged with the voltage determined by the threshold voltage $V_{TH}$ in the offset compensation operation OC, an offset caused by the threshold voltage $V_{TH}$ of the transistor M1 may be compensated in the charge transfer operation.

Referring to FIG. 10E, the sense amplifier circuit may perform a pre-sensing operation PS for connecting the two inverters INV1 and INV2 in the form of a single-ended amplifier (e.g., single-ended two-stage amplifier). During the pre-sensing operation (or fourth period) PS, the sense amplifier circuit may connect an output terminal of the inverter INV1 to an input terminal of the inverter INV2, i.e., the internal node SBLB while maintaining the control signal ISO1 at the bias voltage $V_{TG}$. To this end, the control signal P2L may have the enable level so that the transistor M7 may be turned on. In this case, an output of the inverter INV1, i.e., a voltage of the internal node SBLB may drop close to the ground voltage by the voltage of the internal node SBL, and an output of the inverter INV2 may increase close to the voltage $V_{INTA}$ of the high voltage line LA. In some embodiments, the control signal ISO1 may have the enable level during the pre-sensing operation PS.

Referring to FIG. 10F, the sense amplifier circuit may perform a sensing operation SS for connecting the two inverters INV1 and INV2 in the form of a cross-coupled latch. During the sensing operation (or fifth period) SS, the sense amplifier circuit may connect the output terminal of the inverter INV2 to the input terminal of the inverter INV1 while electrically isolating the bitline BL from the internal node SBL. To this end, the control signal ISO1 may have the disable level $V_L$ so that transistor M1 may be turned off. Further, a control signal P2R may have the enable level so that a transistor M8 may be turned on. Because of turn-on of the transistors M7 and M8, the inverter INV1 and INV2 may form the cross-coupled latch, so that the voltage of the internal node SBL may increase to the high-level voltage $V_{INTA}$ by an output of inverter INV2, and the voltage of the inverter INV1, i.e., the voltage of the internal node SBLB may decrease to the low-level voltage (ground voltage). Therefore, due to a voltage difference dVBL between the internal node SBL corresponding to the bitline BL and the internal node SBLB corresponding to the complementary bitline BLB, the sense amplifier circuit may sense that the data with the high level (i.e., '1') is stored in the memory cell MC1. In this case, since the voltage difference dVBL between the two internal nodes SBL and SBLB becomes relatively large by the charge sharing operation CS and/or the pre-sensing operation PS, accurate sensing may be performed.

Referring to FIG. 10G, the sense amplifier circuit may perform a restoration operation RS for restoring a voltage of the memory cell MC1. For the restoration operation RS, the sense amplifier circuit may turn on the transistor M1 while connecting the two inverters INV1 and INV2 in the form of the cross-coupling latch. The control signal ISO1 may have the enable level $V_H$ so that transistor M1 may be turned on. Therefore, the data of memory cell MC1 may be restored by the output of inverter INV2. In some embodiments, the control signal ISO1 may have a voltage higher than the enable level $V_H$ to completely turn on the transistor M1

Referring to FIG. 11, control signals PG, PV, ISO1, P2L, and P2R may have the same timings as the control signals PG, PV, ISO1, P2L, and P2R described with reference to FIG. 9. Accordingly, a precharge operation PC and an offset compensation operation OC may be performed as described with reference to FIG. 9. In a charge sharing operation CS, since data '0' is stored in a capacitor of a memory cell MC1, a voltage of a bitline BL may decrease due to charge sharing between the memory cell MC1 and the bitline BL. In a charge transfer operation CT, charges (e.g., electrons) may be transferred from the bitline BL to an internal node SBL, so that a voltage of the internal node SBL may decrease. In this case, since a voltage of the bitline BL is close to the ground voltage, the voltage of the internal node SBL may decrease more greatly than in a case shown in FIG. 9.

Next, in a pre-sensing operation PS, since the voltage of the internal node SBL has been greatly reduced, an output of an inverter INV1, i.e., a voltage of an internal node SBLB may increase close to a voltage $V_{INTA}$ of a high voltage line LA by the voltage of the internal node SBL, and an output of an inverter INV2 may decrease close to a ground voltage by the voltage of the internal node SBLB. In a sensing operation SS, the inverter INV1 and INV2 may form a cross-coupled latch, so that the voltage of the internal node SBL may decrease to a low-level voltage (ground voltage) by the output of inverter INV2, and the output of inverter INV2, i.e., the voltage of the internal node SBLB may increase to a high-level voltage $V_{INTA}$. Therefore, due to a voltage difference between the two internal nodes SBL and SBLB, the sense amplifier circuit may sense that data with a low level (i.e., '0') is stored in a memory cell MC1. In a restoration operation RS, the data of the memory cell MC1 may be restored by the output of the inverter INV2.

In some embodiments, during the restoration operation RS, a transistor M2 connected to a complementary bitline BLB may be turned on, and data of a memory cell MC2 connected to the complementary bitline BLB may be restored by the output of the inverter INV1.

Figure 12:
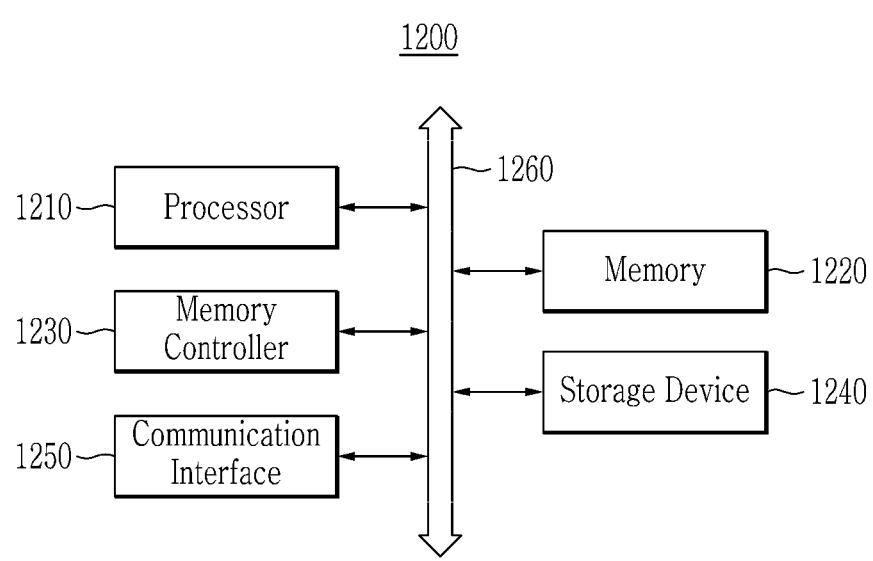
FIG. 12 is a block diagram showing an example of a computing device according to some embodiments.

FIG. 12 is a block diagram showing an example of a computing device according to some embodiments.

Referring to FIG. 12, a computing device 1200 may include a processor 1210, a memory 1220, a memory controller 1230, a storage device 1240, a communication interface 1250, and a bus 1260. The computing device 1200 may further include other general components.

The processor 1210 may control an overall operation of each component of the computing device 1200. The processor 1210 may be implemented with at least one of various processing units such as a central processing unit (CPU), an application processor (AP), and a graphic processing unit (GPU).

The memory 1220 may store various data and instructions. The memory 1220 may be implemented with the memory device described with reference to FIG. 1 to FIG. 11. The memory controller 1230 may control transfers of the data or instructions to and from the memory 1220. In some embodiments, the memory controller 1230 may be provided as a separate chip from the processor 1210. In some embodiments, the memory controller 1230 may be provided as an internal component of the processor 1210.

The storage device 1240 may non-temporarily store programs and data. In some embodiments, the storage device 1240 may be implemented as a non-volatile memory. The communication interface 1250 may support wired or wireless Internet communication of the computing device 1200. In addition, the communication interface 1250 may support various communication methods other than Internet communication. The bus 1260 may provide a communication function between the components of the computing device 1200. The bus 1260 may include at least one type of bus according to a communication protocol between the components.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A sense amplifier circuit comprising:
    a first bitline;
    a first transistor electrically connected between the first bitline and a first node;
    a first inverter comprising a first input terminal electrically connected to the first node and a first output terminal;
    a second inverter comprising a second input terminal electrically connected to a second node and a second output terminal;
    a second transistor comprising a first terminal electrically connected to the first output terminal and a second terminal electrically connected to the second node;
    a third transistor comprising a third terminal electrically connected to the second output terminal and a fourth terminal electrically connected to the first node; and
    a precharge circuit electrically connected to the first node and the second node, and configured to apply a first voltage to the first node and the second node during a first time period, and apply a second voltage higher than the first voltage to the first node and the second node during a second time period,
    wherein a gate of the first transistor is configured to selectively receive a gate voltage from among an enable voltage during precharging of the first bitline by the precharge circuit, a disable voltage when sharing charges between a memory cell and the first bitline, or a bias voltage that is between the enable voltage and the disable voltage when storing offset information of the first transistor.

2. The sense amplifier circuit of claim 1, further comprising:
    a second bitline that forms a complementary bitline pair with the first bitline; and
    a fourth transistor electrically connected between the second bitline and the second node.

3. The sense amplifier circuit of claim 1, wherein the first voltage comprises a ground voltage.

4. The sense amplifier circuit of claim 1,
    wherein the first inverter is electrically connected between a first voltage line configured to transfer a third voltage and a second voltage line configured to transfer the first voltage,
    wherein the second inverter is electrically connected between the first voltage line and the second voltage line, and
    wherein the second voltage is higher than the third voltage.

5. The sense amplifier circuit of claim 1, wherein the precharge circuit comprises:
    a fourth transistor and a fifth transistor connected in series between the first node and the second node;
    a sixth transistor electrically connected between a node between the fourth transistor and the fifth transistor and the first voltage; and
    a seventh transistor electrically connected between the node between the fourth transistor and the fifth transistor and the second voltage.

6. The sense amplifier circuit of claim 1,
    wherein during the first time period, the gate of the first transistor is further configured to receive the enable voltage, and the precharge circuit is further configured to transfer the first voltage to the first node and the second node,
    wherein during the second time period after the first time period, the gate of the first transistor is further configured to receive the disable voltage, and the precharge circuit is further configured to transfer the second voltage to the first node and the second node, wherein during a third time period after the second time period, the gate of the first transistor is further configured to receive the bias voltage, wherein during a fourth time period after the third time period, the gate of the first transistor is further configured to receive the bias voltage, and the second transistor is configured to be turned on while the third transistor is turned off, and wherein during a fifth time period after the fourth time period, the third transistor is further configured to be turned on while the second transistor is turned on.

7. The sense amplifier circuit of claim 6, wherein during a sixth time period between the first time period and the second time period, the gate of the first transistor is further configured to receive the bias voltage, and the precharge circuit is further configured to transfer the second voltage to the first node and the second node.

8. A memory device comprising:
a first memory cell;
a first bitline electrically connected to the first memory cell; and
a sense amplifier circuit comprising:
  a first node;
  a second node;
  a first transistor electrically connected between the first bitline and the first node;
  a first inverter comprising an input terminal that is electrically connected to the first node; and
  a second inverter comprising an input terminal that is electrically connected to the second node,
wherein the sense amplifier circuit is configured to perform operations comprising:
  during a first time period, applying a first voltage to the first node and the second node while the first transistor is turned on;
  during a second time period after the first time period, applying a second voltage higher than the first voltage to the first node and the second node while the first transistor is turned off;
  during a third time period after the second time period, connecting the first bitline and the first node through the first transistor;
  during a fourth time period after the third time period, connecting an output terminal of the first inverter and the input terminal of the second inverter while an output terminal of the second inverter and the input terminal of the first inverter are not connected; and
  during a fifth time period after the fourth time period, connecting the first inverter and the second inverter as a cross-coupled latch while the first transistor is turned off.

9. The memory device of claim 8, further comprising:
a second memory cell; and
a second bitline electrically connected to the second memory cell to form a complementary bitline pair with the first bitline,
wherein the sense amplifier circuit further comprises a second transistor electrically connected between the second bitline and the second node.

10. The memory device of claim 9, wherein the sense amplifier circuit is further configured to, during a sixth time period between the first time period and the second time period, connect the first bitline and the first node to the first transistor, and transfer the second voltage to the first node and the second node.

11. The memory device of claim 10, wherein the sense amplifier circuit is further configured to perform operations comprising:
  during the first time period, applying an enable voltage to a gate of the first transistor to turn on the first transistor;
  during the second time period and the fifth time period, applying a disable voltage to the gate of the first transistor to turn off the first transistor; and
  during the third time period and the sixth time period, applying a bias voltage that is between the enable voltage and the disable voltage to the gate of the first transistor.

12. The memory device of claim 11, wherein the sense amplifier circuit is further configured to, during the fourth time period, apply the bias voltage to the gate of the first transistor.

13. The memory device of claim 8, wherein the first voltage comprises a ground voltage.

14. The memory device of claim 8, wherein the second voltage is higher than a supply voltage of the first inverter and the second inverter.

15. A sensing method of a memory device, comprising:
precharging a bitline with a first voltage;
precharging a first node with a second voltage higher than the first voltage, and sharing charges between a memory cell and the bitline;
transferring the charges between the first node and the bitline;
connecting a first inverter comprising an input terminal that is electrically connected to the first node with a second inverter comprising an input terminal that is electrically connected to a second node as a single-ended amplifier; and
connecting the first inverter and the second inverter as a cross-coupled latch, and sensing data of the memory cell based on a voltage difference between the first node and the second node,
wherein the connecting the first inverter and the second inverter as the single-ended amplifier comprises performing a pre-sensing operation prior to sensing the data of the memory cell to increase the voltage difference between the first node and the second node.

16. The sensing method of claim 15, further comprising:
after precharging the bitline with the first voltage, storing offset information of a transistor configured to connect the first node and the bitline,
wherein the transferring the charges between the first node and the bitline comprises transferring the charges through the transistor.

17. The sensing method of claim 15, wherein the sharing the charges between the memory cell and the bitline comprises electrically isolating the bitline from the first node.

18. The sensing method of claim 15, wherein the sensing the data of the memory cell comprises electrically isolating the bitline from the first node.

* * * * *